US008543175B2

(12) United States Patent
Kobayashi et al.

(10) Patent No.: US 8,543,175 B2
(45) Date of Patent: Sep. 24, 2013

(54) MOBILE TERMINAL DEVICE

(75) Inventors: Hidekatsu Kobayashi, Kawasaki (JP);
Wataru Murata, Kawasaki (JP);
Hiroaki Matsuda, Kawasaki (JP);
Yoshifumi Kajiwara, Kawasaki (JP);
Masamichi Watanabe, Kawasaki (JP);
Tatsuhito Araki, Kawasaki (JP);
Yoshiaki Kato, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 773 days.

(21) Appl. No.: 11/991,154

(22) PCT Filed: Sep. 16, 2005

(86) PCT No.: PCT/JP2005/017186
§ 371 (c)(1),
(2), (4) Date: Feb. 28, 2008

(87) PCT Pub. No.: WO2007/032087
PCT Pub. Date: Mar. 22, 2007

(65) Prior Publication Data
US 2009/0264166 A1 Oct. 22, 2009

(51) Int. Cl.
*H04B 1/38* (2006.01)
(52) U.S. Cl.
USPC .................. 455/575.3; 455/575.1; 455/66.1
(58) Field of Classification Search
USPC ............... 455/550.1, 90.3, 575.1–575.3, 66.1
See application file for complete search history.

(56) References Cited

U.S. PATENT DOCUMENTS

| 5,389,741 A * | 2/1995 | Ueno .......................... 174/117 F |
| 2001/0051510 A1 * | 12/2001 | Nakamura ....................... 455/90 |
| 2002/0006809 A1 * | 1/2002 | Kubo et al. .................... 455/550 |
| 2002/0016182 A1 * | 2/2002 | Kubo et al. .................... 455/550 |
| 2004/0065472 A1 | 4/2004 | Sekijima et al. |
| 2004/0253972 A1 * | 12/2004 | Iwai et al. .................. 455/550.1 |

FOREIGN PATENT DOCUMENTS

| JP | 07-274275 | 10/1995 |
| JP | 2002-335315 | 11/2002 |
| JP | 2004-128205 | 4/2004 |
| JP | 2004-214443 | 7/2004 |
| JP | 2004-319585 | 11/2004 |

OTHER PUBLICATIONS

International Search Report (Form PCT/ISA/210) mailed Jan. 10, 2006 in connection with the International Application PCT/JP2005/017186.

* cited by examiner

*Primary Examiner* — Edward Urban
*Assistant Examiner* — Golam Sorowar
(74) *Attorney, Agent, or Firm* — Staas & Halsey LLP

(57) ABSTRACT

To provide a mobile terminal device that can eliminate influence of static electricity upon signal lines of a signal-line flexible board that is placed through a connecting unit that connects two casings to be able to overlie one another. In the mobile terminal device, one of the casings and the other casing are connected through a connecting unit to be able to overlie one another, and a signal-line flexible board that connects circuit boards housed in one of the casings and the other casing, respectively, is placed through the connecting unit. The mobile terminal device includes a pair of frame-grounded flexible boards that are formed wider than the signal-line flexible board to have a conductor pattern frame grounded, and sandwich both outer surfaces of the signal-line flexible board therebetween.

6 Claims, 9 Drawing Sheets

MOBILE TERMINAL DEVICE

CROSS-REFERENCE TO RELATED APPLICATIONS

This application claims the benefit under 35 U. S. C. Section 371, of PCT International Application Number PCT/JP2005/017186 filed on Sep. 16, 2005, published as WO 2007/032087 on Mar. 22, 2007, the contents of which are incorporated herein by reference.

BACKGROUND OF THE INVENTION

1. Field of the Invention

The present invention relates to a mobile terminal device such as a mobile phone including two casings that are connected through a connecting unit to be able to overlie one another, and, more particularly to a mobile terminal device in which a signal-line flexible board that connects circuit boards housed in the two casings, respectively, is arranged through the connecting unit.

2. Description of the Related Art

Many mobile phones include two casings that can be overlaid one another in a folding manner or the like with a hinge structure, to meet demands for miniaturization and the like. In these mobile phones, to electrically connect circuit boards that are housed in the respective casings, a method of using a signal-line flexible board having high flexibility and providing the signal-line flexible board through a connecting unit such as a hinge structure is employed (see, for example, Japanese Patent Application Laid-open No. 2004-214443 and Japanese Patent Application Laid-open No. H7-274275).

In Japanese Patent Application Laid-open Nos. 2004-214443 and H7-274275, to shield a conductive layer not to output noises generated by the conductive layer or to prevent external noises from affecting the conductive layer, a flexible board including an electromagnetic shielding layer that covers both faces of the conductive layer having a signal line is used.

In some commercially available mobile phones, as shown in FIGS. 12 and 13, one frame-grounded flexible board 702 that is frame grounded is provided outside of plural signal-line flexible boards 701 that are arranged through a connecting unit 700 with a hinge structure, to achieve frame grounding. FIG. 12 is a perspective view of a configuration of relevant parts near a connecting unit of a conventional mobile phone. FIG. 13 is a longitudinal sectional side view of a configuration example of a part of the connecting unit where flexible boards are arranged. In FIG. 12, reference numeral 703 denotes a stationary casing including a transmitter, an operation key, and the like. Reference numeral 704 denotes a movable casing including a receiver, a liquid crystal display, and the like. The movable casing 704 has a configuration that is divided into two parts of a front armored case 705 that is located on the display face side, and a back armored case 706 that is located on the back face side, for example as shown in FIG. 13.

The casing 703 includes cylindrical bearing armored tubes 709 and 710 that are protrudingly formed on both sides of an end and into which a spindle 708 of the hinge structure is fitted. The front armored case 705 of the casing 704 includes cylindrical bearing armored tubes 711 and 712 that are protrudingly formed at an end to be located inside in the width direction of the bearing armored tubes 709 and 710 and into which the spindle 708 is fitted. The front armored case 705 includes a bearing armored unit 713 that is integrally formed abreast of the bearing armored tube 711 to form an approximately semi-cylindrical shape. The back armored case 706 includes a bearing armored unit 714 that is formed in an approximately semi-cylindrical shape at a position corresponding to the bearing armored unit 713 and with the same width as that of the bearing armored unit 713. When the front armored case 705 and the back armored case 706 are combined, the bearing armored units 713 and 714 are engaged to form a bearing armored tube 715 interiorly having a cylindrical space. The armored cases 705 and 706 are formed as metallic cases of Mg, for example, to provide the strength while the bearing armored unit 714 is formed as a separate member of a resin material such as acrylonitrile butadiene styrene (ABS). The casing 703 includes a bearing armored tube 716 that is protrudingly formed at an end to be located between the bearing armored tubes 715 and 712. The bearing armored tube 716 is formed by combining two semi-cylindrical bearing armored units, like the bearing armored tube 715.

The signal-line flexible board 701 and the frame-grounded flexible board 702 are arranged through the connecting unit 700 to pass through the bearing armored tubes 715 and 716 having cylindrical spaces. The signal-line flexible board 701 and the frame-grounded flexible board 702 are curled to make one turn in the connecting unit 700, to prevent line breaking resulting from an opening or closing operation of the casings 703 and 704 and to provide satisfactory following capability. The signal-line flexible board 701 and the frame-grounded flexible board 702 are formed to have the same width as shown in FIG. 14. FIG. 14 is an enlarged plan view of the signal-line flexible board 701 and the frame-grounded flexible board 702. The frame-grounded flexible board 702 on which a frame-grounded conductor pattern 717 is entirely formed has a coverlay 718 made of a nonconductive material on the both sides, and the coverlay 718 covers edges of the conductor pattern 717, as shown in FIG. 15. FIG. 15 is a partially enlarged plan view of the frame-grounded flexible board 702.

The user grips the mobile phone with his/her hand to operate or carry around it. When static electricity resulting from electric charging or discharging of the user enters the mobile phone, the static electricity may fall in a part where flowing of static electricity through the circuitry is undesirable. Particularly, the connecting unit 700 with the hinge structure as shown in FIG. 12 has a gap 719 between the bearing armored tubes 715 and 176. Therefore, the static electricity falling in the gap 719 enters the inner space through the gap 719, and is secondarily discharged to the signal-line flexible board 701 that are arranged in the inner spaces of the bearing armored tubes 715 and 716 to flow through the signal line. Consequently, the static electricity adversely falls in an inner circuit on a circuit board in the casing 703 or 704. In the configuration in which the frame-grounded flexible board 702 is provided outside the signal-line flexible board 701 as shown in FIG. 12 and the like, the boards are curled to make one turn in the inner space. Accordingly, the static electricity falling in the gap 719 can be secondarily discharged to the signal-line flexible board 701 prior to the conductor pattern 717 of the frame-grounded flexible board 702 and flow through the signal line. Thus, countermeasures against static electricity are insufficient.

As described in Japanese Patent Application Laid-open No. 2004-214443 and Japanese Patent Application Laid-open No. H7-274275, also when a flexible board having a conductive layer both sides of which are covered by an electromagnetic shielding layer is employed, the electromagnetic shielding layer is grounded for shielding, while it is not to prevent external static electricity from affecting the signal line. Therefore, the flexible board does not fulfill a function as a lighting conductor against the static electricity, and static electricity can flow through the signal line in the conductive layer. Thus, the countermeasures against static electricity are insufficient. That is, although the flexible board includes a grounded electromagnetic shielding layer, a gap with the signal line in the conductive layer is only about several micrometers. Accordingly, when the static electricity flows through the electromagnetic shielding layer, the signal line is right near the electromagnetic shielding layer. Thus, the influence upon the signal line is not negligible, and the static electricity is highly likely to flow also through the signal line.

In a mobile terminal device including two casings that are foldably connected through a connecting unit such as a hinge structure, it is difficult to eliminate a gap between the casings at the connecting unit because of the movable structure. Therefore, it is hard to prevent generated static electricity from entering the connecting unit.

In view of this, for the mobile terminal device in which a signal-line flexible board is provided through a connecting unit such as a hinge structure, effective countermeasures against static electricity are demanded. Particularly nowadays, the mobile phones are ordinarily indispensable devices. Because it is natural to carry around the mobile phone to operate it, countermeasures against static electricity are important, not just for dry seasons when static electricity is easily produced on human bodies.

SUMMARY OF THE INVENTION

It is an object of the present invention to at least partially solve the problems in the conventional technology.

According to an aspect of the present invention, a mobile terminal device includes two casings, each containing a circuit board, connected through a connecting unit to be able to overlie one another; a signal-line flexible board that is provided through the connecting unit to connect the circuit boards of the casings; and a pair of frame-grounded flexible boards that are formed wider than the signal-line flexible board to have a conductor pattern frame grounded, and sandwich both outer surfaces of the signal-line flexible board therebetween.

According to another aspect of the present invention, a mobile terminal device includes two casings, each containing a circuit board, foldably connected through a connecting unit having a hinge structure; and a signal-line flexible board that is placed through the connecting unit to connect the circuit boards of the casings, wherein one of the casings includes a grounded antenna plate near the connecting unit, and the antenna plate includes an extended plate member that is extended into the connecting unit to turn around outside of the signal-line flexible board from a part of the antenna plate.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Exemplary embodiments of a mobile terminal device according to the present invention will be explained below in detail with reference to the accompanying drawings. Note that the invention is not limited to the embodiments.

Figure 1:
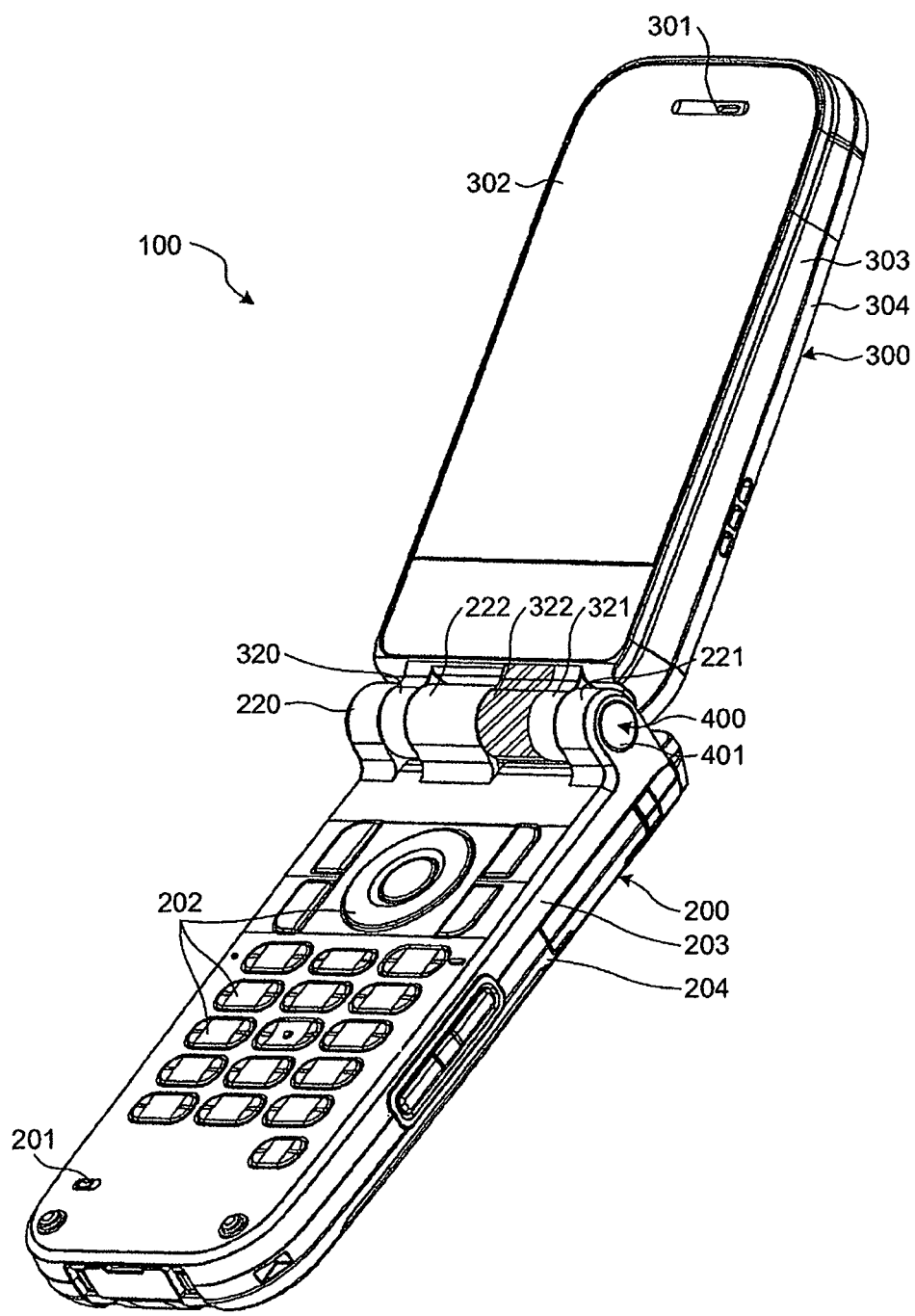
FIG. 1 is an outline perspective view of a mobile terminal device according to a first embodiment of the present invention.

FIG. 1 is an outline perspective view of a mobile terminal device according to a first embodiment of the present invention. The mobile terminal device according to the first embodiment is specifically a mobile phone 100. The mobile phone 100 includes two palm-sized casings 200 and 300, and a connecting unit 400 that connects these casings 200 and 300 to be able to overlie one another. According to the first embodiment, the connecting unit 400 includes a hinge structure, and foldably connects the casings 200 and 300. The casing 200 is a stationary casing including a transmitter 201, operation keys 202 such as a dial key and a function key, and the like. The casing 300 is a movable casing including a receiver 301, a liquid crystal display 302, and the like. FIG. 1 depicts a state where the movable casing 300 is opened from the stationary casing 200. The casing 200 has a configuration that is divided into two cases of a front armored case 203 that is located on the side of an operation face as an inner surface and a back armored case 204 that is located on the side of a back face as an outer surface. Similarly, the casing 300 has a configuration that is divided into two cases of a front armored case 303 that is located on the side of a display face as an inner surface and a back armored case 304 that is located on the side of a back face as an outer surface.

Figure 2:
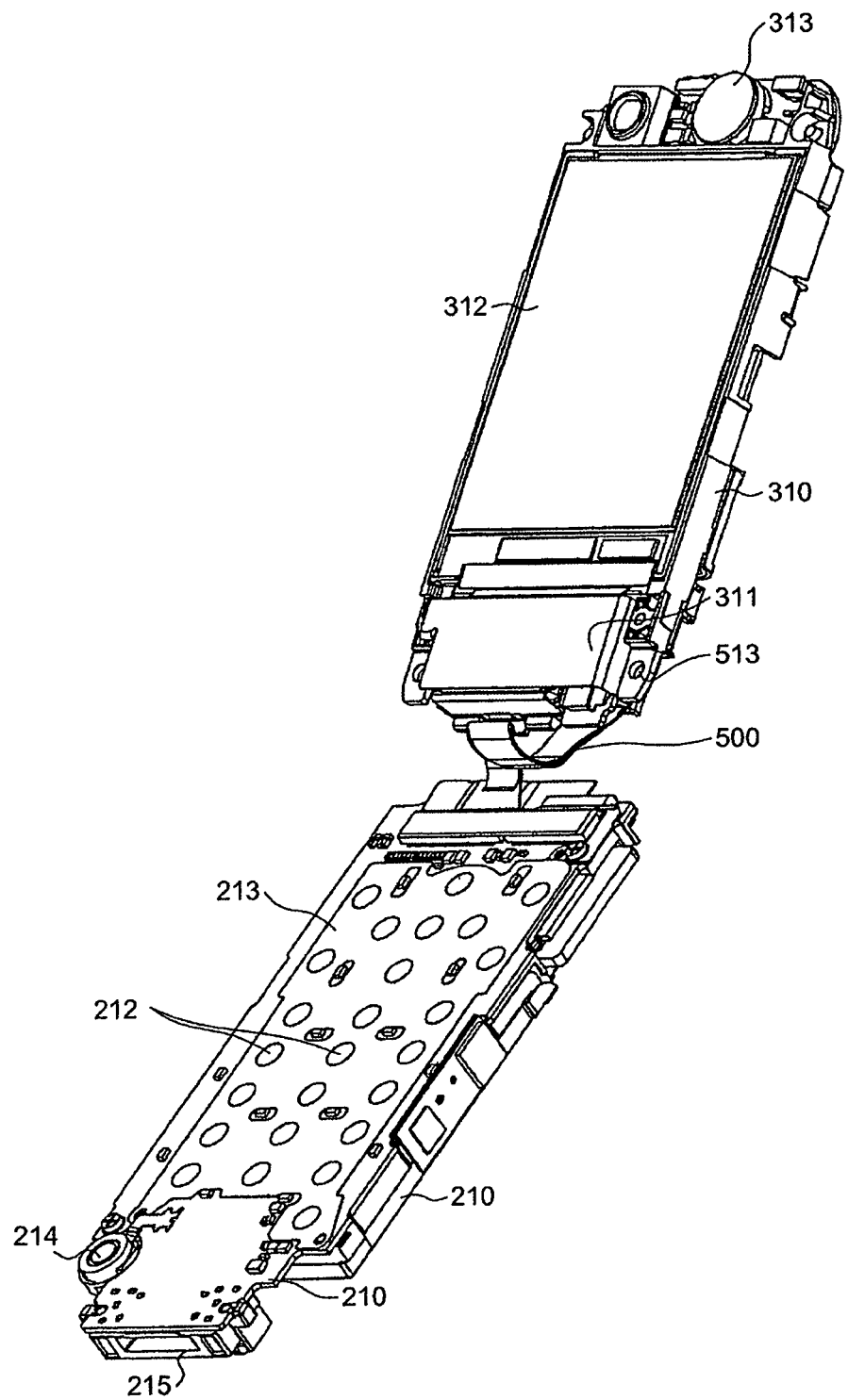
FIG. 2 is an outline perspective view of an inner configuration example of a mobile phone from which armored cases are removed.

FIG. 2 is an outline perspective view of an inner configuration example of the mobile phone from which the armored cases are removed. The stationary casing 200 includes a circuit board 211 that is supported by an inner frame 210 and the like. Various circuit components are mounted on the circuit board 211. On the front surface thereof on the side of the front armored case 203, a key sheet 213 on which plural key switches 212 corresponding to the operation keys 202 are arranged, a microphone 214, and a charging connector 215 are mounted. The movable casing 300 includes a circuit board 311 that is supported by an inner frame 310 and the like. A receiving circuit component, a display circuit component, and the like are mounted on the circuit board 311. On the front surface thereof on the side of the front armored case 303, a liquid crystal panel 312 corresponding to the liquid crystal display 302, a speaker 313, and the like are mounted.

Figure 3:
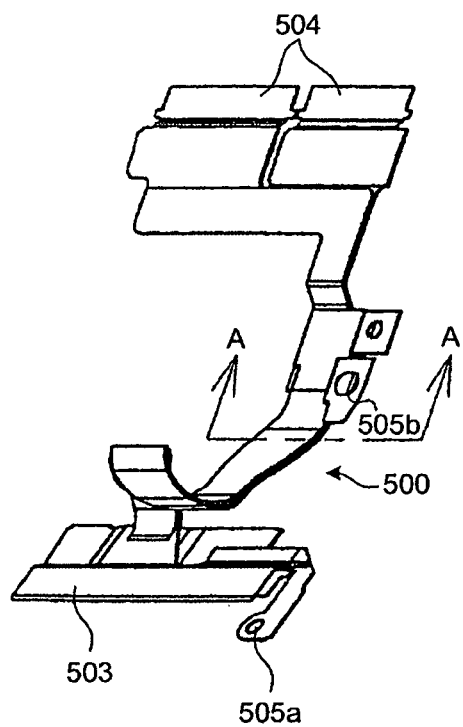
FIG. 3 is an outline perspective view of a configuration example of a flexible board group.
Figure 4:
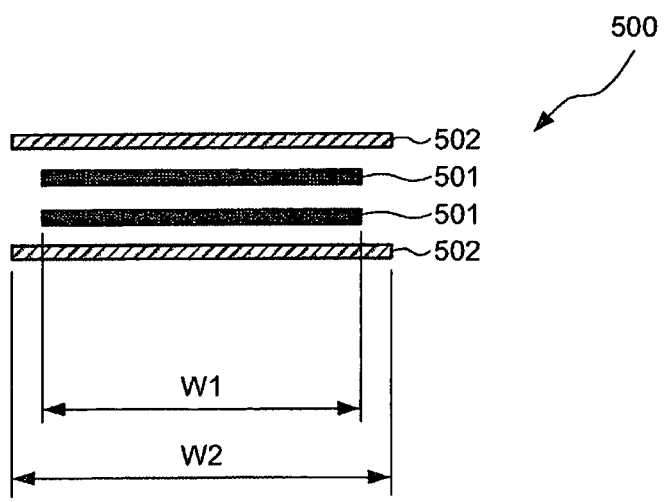
FIG. 4 is an enlarged cross section along a line A-A of FIG. 3.

The mobile phone 100 according to the first embodiment includes a flexible board group 500 that is provided through the connecting unit 400. FIG. 3 is an outline perspective view of a configuration example of the flexible board group 500. FIG. 4 is an enlarged cross section along a line A-A of FIG. 3. The flexible board group 500 has an overlaid configuration of signal-line flexible board 501, and a pair of frame-grounded flexible boards 502 that sandwich both outer surfaces of the signal-line flexible board 501 therebetween. The flexible board group 500 is curled to make one turn in the connecting unit 400. The signal-line flexible board 501 includes a signal line pattern for electrically connecting the circuit boards 211 and 311 installed in the corresponding casing 200 and 300, an insulating layer that covers the signal line pattern, and the like. Due to restrictions of the width of the connecting unit 400 in which the signal-line flexible board 501 is provided, plural, for example two signal-line flexible boards are separately formed in the first embodiment. Each of the signal-line flexible boards 501 has, at opposite ends, connector units 503 and 504 for connecting to connectors that are located at positions corresponding to ends of the circuit boards 211 and 311, respectively.

Figure 5:
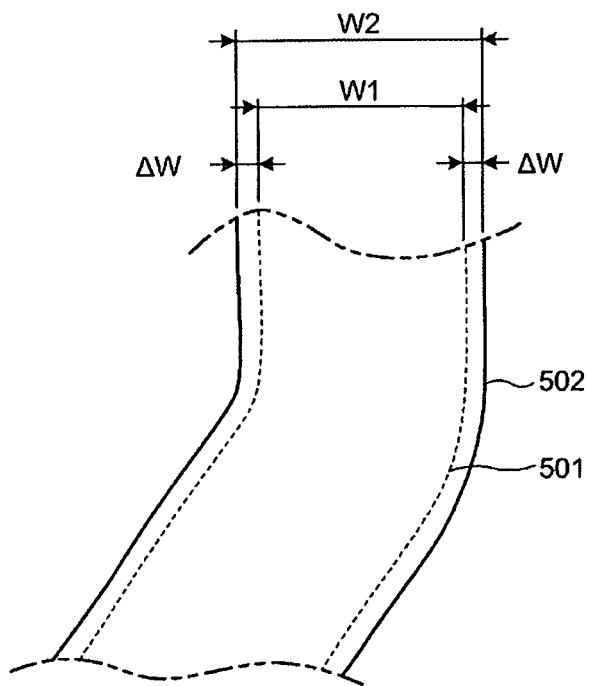
FIG. 5 is an enlarged plan view of a part of the flexible board group.
Figure 6:
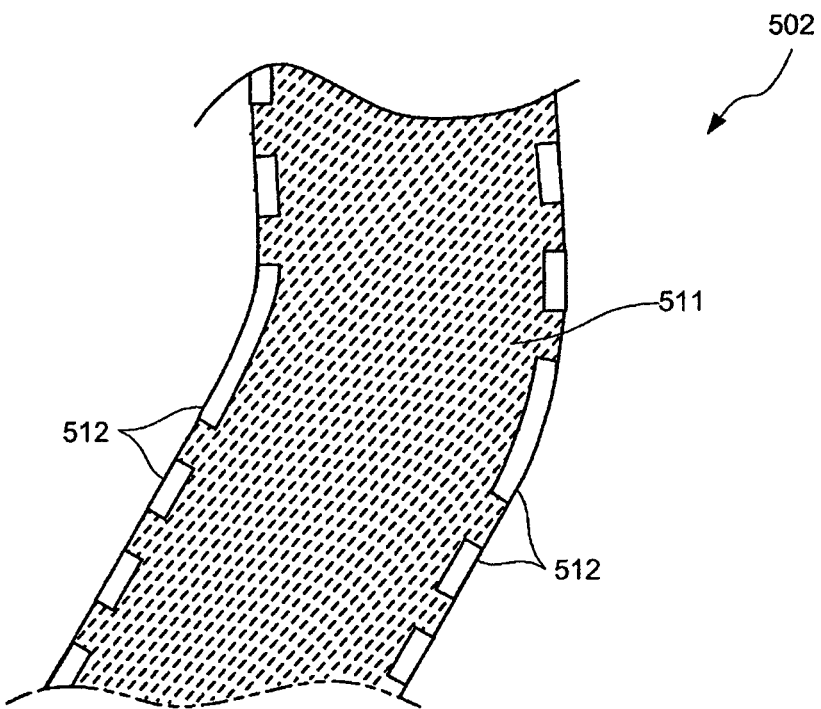
FIG. 6 is an enlarged plan view of a part of a frame-grounded flexible board.

The frame-grounded flexible board 502 is explained next. FIG. 5 is an enlarged plan view of a part of the flexible board group 500. FIG. 6 is an enlarged plan view of a part of the frame-grounded flexible board 502. As shown in FIG. 6, a conductor pattern 511 for frame grounding is entirely formed on the frame-grounded flexible board 502. The frame-grounded flexible board 502 is frame grounded by connecting connection terminals 505a and 505b at the ends to predetermined positions of the circuit boards 211 and 311. As shown in FIGS. 4 and 5, the frame-grounded flexible board 502 is formed wider than that of the signal-line flexible board 501. For example, when the width W1 of the signal-line flexible board 501 is about 5 millimeters, the width W2 of the frame-grounded flexible board 502 is about 6 millimeters and is wider by ΔW of about 0.5 millimeter on the opposite sides, respectively. The frame-grounded flexible board 502 has a coverlay 512 as reinforcement made of a nonconductive material on the opposite sides. The coverlay 512, as shown in FIG. 6, has a configuration in which parts of the edge faces wider than the signal-line flexible board 501 are peeled intermittently in the longitudinal direction of the frame-grounded flexible board 502 to expose the conductor pattern 511. An exposition pattern according to the first embodiment has a regular rectangular saw-toothed shape, while the exposition pattern is not limited thereto and an arbitrary pattern can be employed. Particularly at a cranked portion of the frame-grounded flexible board 502, the coverlay 512 can be remained as shown in FIG. 6. The flexible board group 500 is formed in a crank shape (see FIGS. 5 and 6) so that when it is curled to make one turn in the connecting unit 400, the curled portion is kept parallel to the central axis of the connecting unit 400 while the leading positions to the two casings 200 and 300 are different in the width direction of the casings (see FIG. 8).

Figure 7:
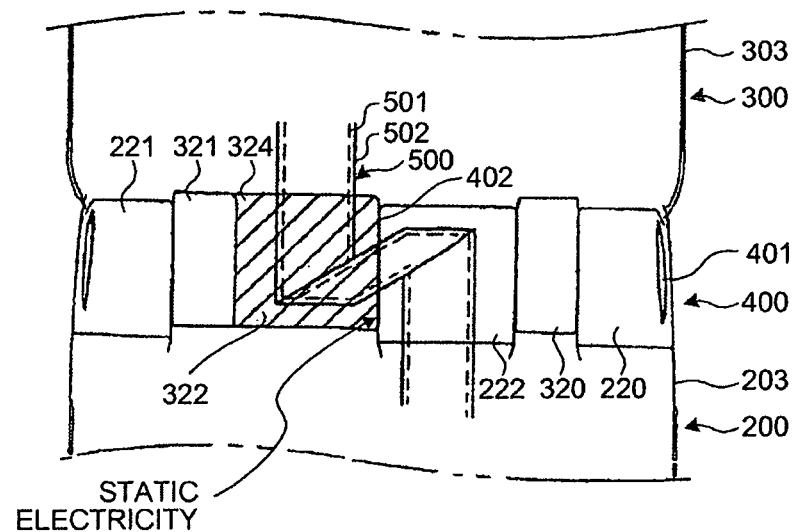
FIG. 7 is a perspective view of a configuration example of relevant parts near a connecting unit of a mobile phone according to the first embodiment.
Figure 8:
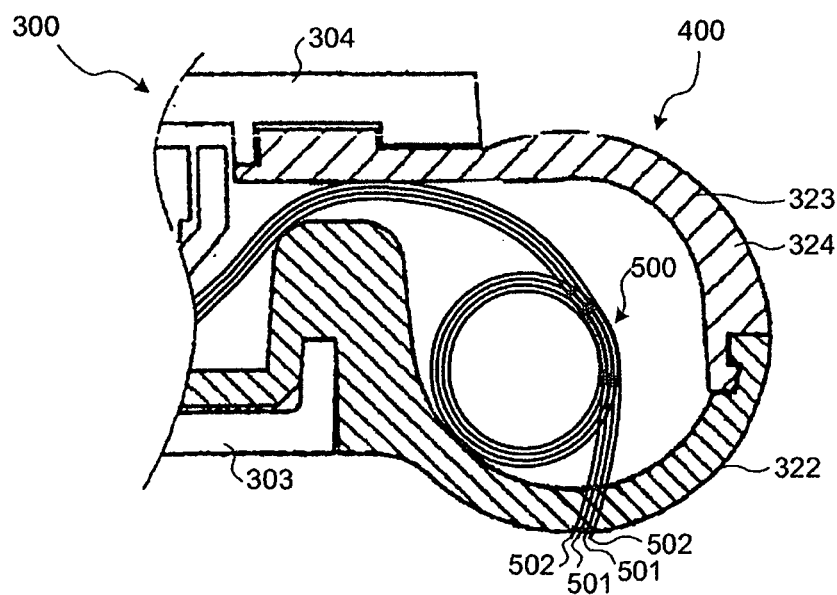
FIG. 8 is a longitudinal sectional side view of a configuration example at a part where the flexible board group is placed in the connecting unit.

A configuration example of the connecting unit 400 for the flexible board group 500 is explained next. FIG. 7 is a perspective view of a configuration example of relevant parts near the connecting unit 400 of the mobile phone 100 according to the first embodiment. FIG. 8 is a longitudinal sectional side view of a configuration example at a part where the flexible board group 500 is placed in the connecting unit 400. The front armored case 203 of the stationary casing 200 includes cylindrical bearing armored tubes 220 and 221 that are protrudingly formed on both sides of an end and into which a spindle 401 of the hinge structure is fitted. The front armored case 303 of the movable casing 300 includes cylindrical bearing armored tubes 320 and 321 that are protrudingly formed at an end to be located inside in the width direction of the bearing armored tubes 220 and 221, and into which the spindle 401 is fitted. The front armored case 303 includes a bearing armored unit 322 that is integrally formed abreast of the bearing armored tube 321 to form an approximately semi-cylindrical shape. The back armored case 304 includes a bearing armored unit 323 that is formed in an approximately semi-cylindrical shape at a position corresponding to the bearing armored unit 322 and with the same width as that of the bearing armored unit 322. When the front armored case 303 and the back armored case 304 are combined, the bearing armored units 322 and 323 are engaged to form a bearing armored tube 324 interiorly having a cylindrical space. The armored cases 303 and 304 are formed as metallic cases of Mg or Al, for example, to provide strength. The bearing armored units 322 and 323 shown as shaded portions in FIGS. 1 and 8, however, are formed as separate members of a resin material such as ABS, respectively. The stationary casing 200 includes a bearing armored tube 222 that is protrudingly formed at an end to be located between the bearing armored tubes 324 and 320. The bearing armored tube 222 is formed by combining two semi-cylindrical bearing armored units 223 and 224 formed at ends of the armored cases 203 and 204, like the bearing armored tube 324. The flexible board group 500 is provided as shown in FIG. 7 to be led into the casings 200 and 300 through the inner spaces of the bearing armored tubes 222 and 324 in the connection unit 400.

The operation is explained next. A case is considered that static electricity with which the user is charged and which is discharged from the user enters through a gap 402 between the bearing armored tubes 222 and 324 of the connecting unit 400. According to the first embodiment, even when static electricity enters through the gap 402, the wider frame-grounded flexible boards 502 are provided on both outer surfaces of the signal-line flexible boards 501. Accordingly, a ground larger than the signal line is established, and thus the static electricity is likely to flow through the frame-grounded flexible boards 502, so that the static electricity can be positively led to the frame ground. The frame-grounded flexible boards 502 are provided as separate boards from the signal-line flexible board 501, and the flexible boards 501 and 502 properly include the insulating layer and the like, respectively. Therefore, a gap between the conductor pattern 511 and the signal line can be made slightly larger than in a configuration using the same board, thereby providing a function as a lighting conductor. Thus, the static electricity flowing through the frame-grounded flexible boards does not affect the signal line. The both outer surfaces of the signal-line flexible board 501 are sandwiched by the frame-grounded flexible boards 502. Therefore, even when the signal-line flexible board 501 is made of plural boards (for example, two boards) and these boards are curled to make one turn in the connecting unit 400, the influence of the static electricity upon the signal line can be prevented.

Particularly according to the first embodiment, the edge faces of the coverlay 512 that is wider than the signal-line flexible board 501 are intermittently peeled in the longitudinal direction of the frame-grounded flexible board 502 to expose the conductor pattern 511. Therefore, even when the static electricity tries to enter the signal line from the side that is sandwiched by a pair of the frame-grounded flexible boards 502, the signal line is located at a position inner than the frame-grounded flexible board 502 and the bare conductor pattern 511 is located at the outer edges. Therefore, the static electricity is likely to flow through the exposed part of the conductor pattern 511 before flowing into the signal line, so that the function as a lighting conductor is enhanced. Because the coverlay 512 is not entirely peeled, the strength of the frame-grounded flexible board 502 is maintained.

According to the first embodiment, in the hinge structure, the bearing armored tubes 222 and 324 as armored cases for a part where the flexible board group 500 is placed are made of a resin material having the insulating property. Therefore, a creepage distance of a case that the static electricity enters from the gap 402 of the connecting unit 400 and tries to fall in the signal line is assured, and the influence of the static electricity can be reduced more than in the case that the armored cases at the corresponding part are made of metal.

Figure 9:
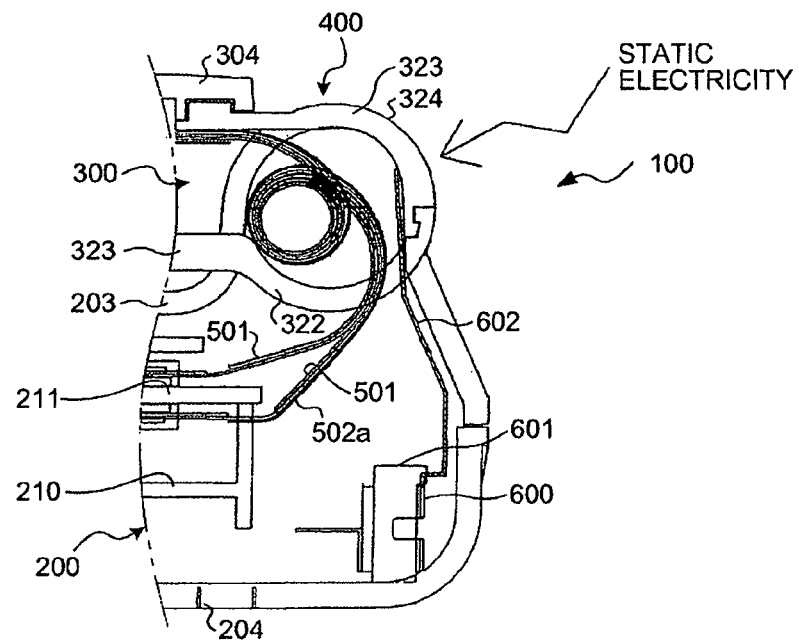
FIG. 9 is a longitudinal sectional side view of a configuration example near a connecting unit of a mobile phone according to a second embodiment of the present invention.
Figure 10:
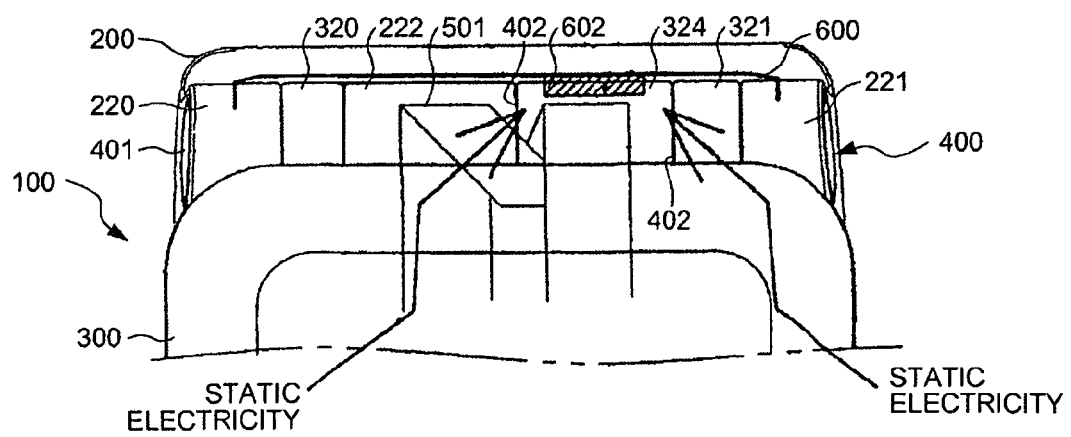
FIG. 10 is a perspective view of a configuration example of relevant parts near the connecting unit of the mobile phone according to the second embodiment.
Figure 11:
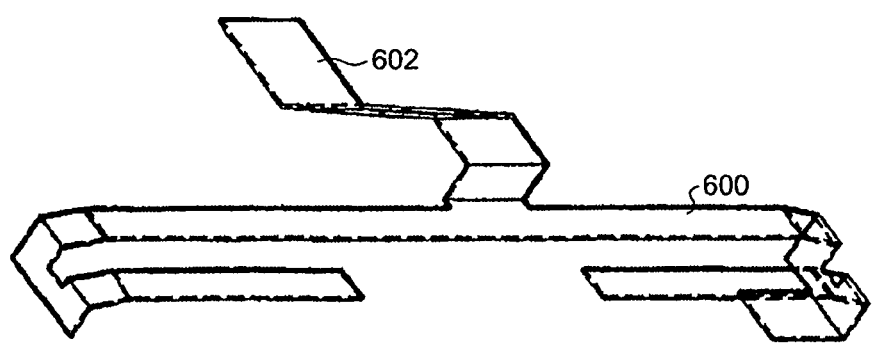
FIG. 11 is an outline perspective view of a shape of an antenna plate.
Figure 12:
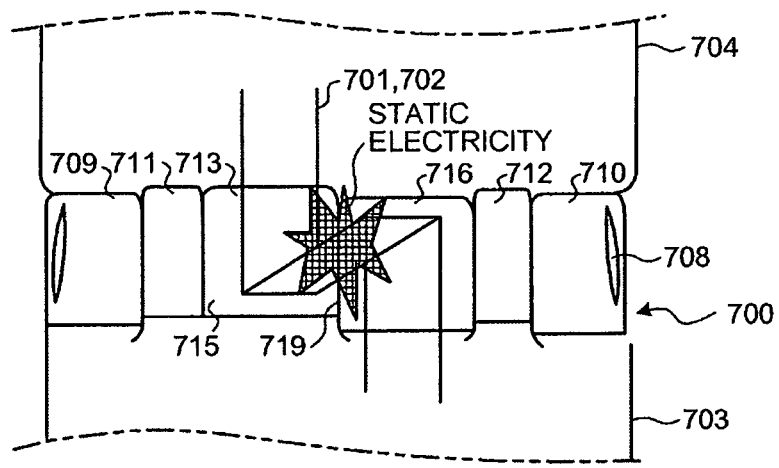
FIG. 12 is a perspective view of a configuration of relevant parts near a connecting unit of a conventional mobile phone.
Figure 13:
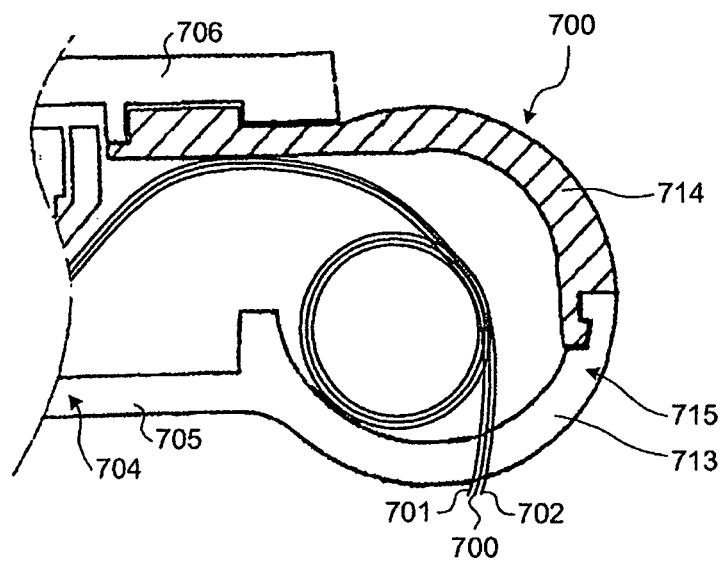
FIG. 13 is a longitudinal sectional side view of a configuration example of a part of the connecting unit where flexible boards are arranged.
Figure 14:
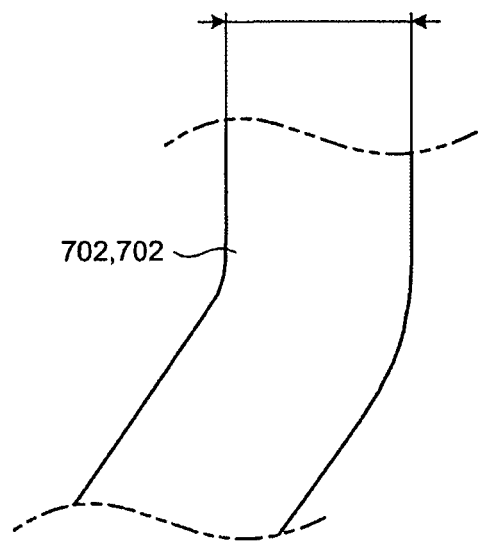
FIG. 14 is a partially enlarged plan view of a signal-line flexible board and a frame-grounded flexible board.
Figure 15:
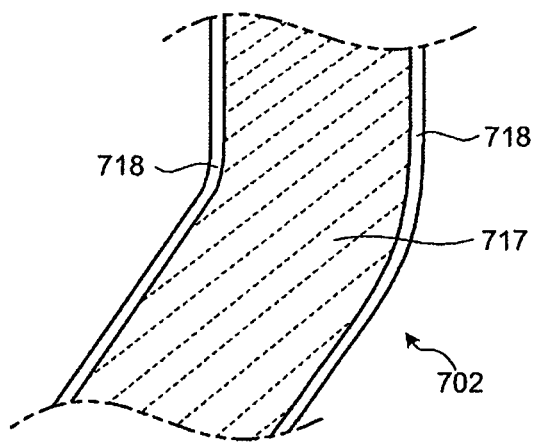
FIG. 15 is a partially enlarged plan view of the frame-grounded flexible board.

FIG. 9 is a longitudinal sectional side view of a configuration example near a connecting unit of a mobile phone according to a second embodiment of the present invention. FIG. 10 is a perspective view of a configuration example of relevant parts near the connecting unit of the mobile phone according to the second embodiment. As the mobile phone 100 according to the second embodiment, an application to a mobile phone the casing 200 of which includes an antenna plate 600 near the connecting unit 400 is illustrated. The antenna plate 600 is located at an end of the back armored case 204 of the stationary casing 200 on the side of the connecting unit 400, all along the width direction of the casing via a resin material 601 in a support form corresponding to the antenna plate 600 or the like, and is frame grounded. FIG. 11 is an outline perspective view of a shape of the antenna plate 600. According to the second embodiment, the antenna plate 600 integrally includes an extended plate member 602 that is bent and extended in a shape according to inner walls of the back armored case 204 and the front armored case 203 to turn around outside of the signal-line flexible board 501, correspondingly to the placement position where the signal-line flexible board 501 is provided through the connecting unit 400. As shown in FIG. 10, the extended plate member 602 is formed wider than the signal-line flexible board 501. In the second embodiment, only on an outer surface of an outer signal-line flexible board 501a among plural, for example two signal-line flexible boards 501, a frame-grounded flexible board 502a is integrally formed.

According to the mobile phone 100 with this configuration, the extended plate member 602 works as a lighting conductor. Accordingly, even when static electricity enters through the gap 402 of the connecting unit 400, the extended plate member 602 in the inner space can positively lead the static electricity to the frame ground. Therefore, the influence of the static electricity upon the signal line on the signal-line flexible board 501 can be eliminated. Particularly because the extended plate member 602 is wider than the signal-line flexible board 501, the static electricity entering through the gap 402 is likely to flow through the extended plate member 602. Accordingly, the function as the lighting conductor can be reliably achieved.

According to the second embodiment, the application to the configuration in which the frame-grounded flexible board 502a is integrally formed only on the outer surface of the signal-line flexible board 501a has been explained. However, the present invention can be similarly applied to the configuration as described in the first embodiment that employs the flexible board group 500 having a pair of the frame-grounded flexible boards 502 formed on both outer surfaces of the signal-line flexible board 501. Particularly in this case, two lighting conductor effects by a pair of the frame-grounded flexible boards 502 and the extended plate member 602 can be achieved. Therefore, more reliable countermeasures against static electricity are established.

According to the first and second embodiments, the present invention is applied to the mobile phone 100 having the folding connecting unit 400 with a hinge structure. However, the present invention can be applied not only to the illustrated hinge structure but also various kinds of hinge structures. The mobile phone is not limited to a folding type with a hinge structure. The present invention can be similarly applied to a mobile phone including casings that can be overlaid one another for example with a slide connecting unit.

With the configuration as described above, even when static electricity enters through a gap in the connecting unit, the wider frame-grounded flexible boards are placed on both outer surfaces of the signal-line flexible board, so that a larger ground than the signal line is established. Accordingly, the static electricity is likely to flow through the frame-grounded flexible boards, and thus the static electricity can be positively led to the frame ground. At this time, the frame-grounded flexible boards are provided as separate boards from the signal-line flexible board. Therefore, a gap with the signal line can be increased as much as possible, to provide a function as a lighting conductor. Consequently, the static electricity flowing through the frame-grounded flexible boards can be prevented from affecting the signal line.

With the configuration as described above, even when the static electricity tries to enter into the signal line from a side that is sandwiched by the frame-grounded flexible boards, the signal line is located at a position inner than the frame-grounded flexible boards, and the bare conductor pattern is located at the outer edges. Accordingly, the static electricity is likely to flow through the exposed portion of the conductor pattern before flowing through the signal line, so that the function as the lighting conductor can be improved. Because the enforcement is not peeled entirely, the strength of the frame-grounded flexible boards can be maintained.

According to an embodiment of the present invention, a creepage distance of a case that the static electricity enters through the gap in the connecting unit and tries to fall in the signal line can be assured by the armored cases made of a resin material. Thus, the influence of the static electricity can be reduced.

According to the present invention, in addition to a pair of the frame-grounded flexible boards working as the lighting conductor, the extended plate member works as the lighting conductor. Therefore, the static electricity entering through the gap in the connecting unit can be positively led to the frame ground by the extended plate member. Accordingly, the influence of the static electricity upon the signal line on the signal-line flexible board can be eliminated.

According to an embodiment of the present invention, the extended plate member reliably works as the lighting conductor, so that the influence of the static electricity upon the signal line on the signal-line flexible board can be eliminated.

According to an embodiment of the present invention, required electrical connection between circuit boards can be assured under conditions that are subjected to restrictions of the width or configuration of the connecting unit. Besides, because a pair of the frame-grounded flexible boards are placed on the both outer surfaces of the signal-line flexible boards, the influence of the static electricity upon the signal line on the signal-line flexible board when the static electricity enters can be eliminated.

According to an embodiment of the present invention, even when the signal-line flexible board is curled to make one turn in the connecting unit to prevent line breaking resulting from the opening or closing operation of the casings and to provide satisfactory following capability, a pair of the frame-grounded flexible boards are placed on both outer surfaces of the signal-line flexible boards. Accordingly, the influence of the static electricity upon the signal line on the signal-line flexible board when the static electricity enters can be eliminated.

According to an embodiment of the present invention, the extended plate member works as the lighting conductor, and the static electricity entering through the gap in the connecting unit can be positively led by the extended plate member to the frame ground. Therefore, the influence of the static electricity upon the signal line on the signal-line flexible board can be eliminated.

According to an embodiment of the present invention, the extended plate member reliably works as the lighting conductor. Therefore, the influence of the static electricity upon the signal line on the signal-line flexible board can be eliminated.

According to an embodiment of the present invention, required electrical connection between circuit boards can be assured under conditions that are subjected to restrictions of the width or configuration of the connecting unit. Besides, because the extended plate member that extends from a part of the antenna plate is provided, the influence of the static electricity upon the signal line on the signal-line flexible board when the static electricity enters can be eliminated.

According to an embodiment of the present invention, even when the signal-line flexible board is curled to be make one turn in the connecting unit to prevent line breaking resulting from the opening or closing operation of the casings and to provide satisfactory following capability, the extended plate member that extends from a part of the antenna plate is provided, so that the influence of the static electricity upon the signal line on the signal-line flexible board when the static electricity enters can be eliminated.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A mobile terminal device comprising:
    two casings, each containing a circuit board, connected through a connecting unit to be able to overlie one another;
    a signal-line flexible board that is provided through the connecting unit to connect the circuit boards of the casings; and
    a pair of frame-grounded flexible boards that are formed wider than the signal-line flexible board to have a conductor pattern frame grounded, and sandwich both outer surfaces of the signal-line flexible board therebetween,
    wherein the frame-grounded flexible boards have a reinforcement of a nonconductor material on both sides of an outer surface not facing to the signal-line flexible board, and edge faces of the reinforcement wider than the signal-line flexible board are intermittently peeled in the longitudinal direction of the frame-grounded flexible boards to expose the conductor pattern.

2. The mobile terminal device according to claim 1, wherein
    the connecting unit has a foldable hinge structure, and armored cases of the casings are metallic cases, and
    a part of the armored cases in the hinge structure at which the signal-line flexible board is placed, is made of a resin material.

3. The mobile terminal device according to claim 1, wherein
    one of the casings includes a grounded antenna plate near the connecting unit, and
    the antenna plate includes an extended plate member that is extended into the connecting unit to turn around outside of the signal-line flexible board from a part of the antenna plate.

4. The mobile terminal device according to claim 3, wherein the extended plate member is formed wider than the signal-line flexible board.

5. The mobile terminal device according to claim 1, wherein the signal-line flexible board includes plural boards.

6. The mobile terminal device according to claim 1, wherein the connecting unit has a foldable hinge structure, and the signal-line flexible board is curled to make one turn in the hinge structure.

* * * * *